United States Patent [19]
Mazure et al.

[11] Patent Number: 5,235,203
[45] Date of Patent: Aug. 10, 1993

[54] INSULATED GATE FIELD EFFECT TRANSISTOR HAVING VERTICALLY LAYERED ELEVATED SOURCE/DRAIN STRUCTURE

[75] Inventors: Carlos Mazure; Marius Orlowski; Matthew S. Noell, all of Austin, Tex.

[73] Assignee: Motorola, Inc., Schaumburg, Ill.

[21] Appl. No.: 722,416

[22] Filed: Jun. 27, 1991

[51] Int. Cl.$^5$ ............................................. H01L 29/76
[52] U.S. Cl. .................................. 257/408; 257/344; 257/382
[58] Field of Search ................ 357/23.3, 23.4; 437/41; 257/344, 382, 408

[56] References Cited

U.S. PATENT DOCUMENTS

| | | | |
|---|---|---|---|
| 4,948,745 | 8/1990 | Pfiester et al. | 437/41 |
| 5,068,696 | 11/1991 | Yang et al. | 357/23.3 |
| 5,102,816 | 4/1992 | Manukonda et al. | 437/41 |

FOREIGN PATENT DOCUMENTS

| | | | |
|---|---|---|---|
| 61-255069 | 11/1986 | Japan | 357/23.3 |
| 62-217665 | 9/1987 | Japan | 357/23.3 |
| 63-292678 | 11/1988 | Japan | 357/23.3 |
| 63-296278 | 12/1988 | Japan | 357/23.3 |
| 1-49266 | 2/1989 | Japan | 357/23.3 |
| 2-303036 | 12/1990 | Japan | 357/23.3 |

OTHER PUBLICATIONS

Semiconductor Devices–Physics and Technology, p. 376, S. M. Sze, 1985.

*Primary Examiner*—Rolf Hille
*Assistant Examiner*—Steven Loke
*Attorney, Agent, or Firm*—Jasper W. Dockrey

[57] ABSTRACT

An insulated gate field effect transistor having a vertically layered elevated source/drain structure includes an electrically conductive suppression region for resistance to hot carrier injection. The device includes a semiconductor substrate of first conductivity type having a gate insulator disposed on the surface of that substrate. A gate electrode, in turn, is disposed on the gate insulator. A lightly doped drain region of second conductivity type is formed in the substrate in alignment with the gate electrode. An electrically conductive suppression region having a first low electrical conductivity is positioned to electrically contact the drain region, but is electrically isolated from the gate electrode and is spaced a first distance from the gate electrode. A heavily doped drain contact also contacts the drain region and is spaced further away from the gate electrode than is the electrically conducted suppression region.

14 Claims, 2 Drawing Sheets

INSULATED GATE FIELD EFFECT TRANSISTOR HAVING VERTICALLY LAYERED ELEVATED SOURCE/DRAIN STRUCTURE

FIELD OF THE INVENTION

This invention relates generally to insulated gate field effect transistors, and more specifically to field effect transistors having structure resistant to hot carrier degradation.

BACKGROUND OF THE INVENTION

Integrated circuits being designed with increasing device density, with more and more complex circuit functions being crowded into the same device area. In order to accommodate the increasing density and increasing complexity of the circuit functions, the size of each individual device is being reduced. The reduction in device size implies a reduction in the dimensions of each individual device. As the gate length of an insulated gate field effect transistor decreases, serious device design problems are encountered. The most significant of these problems is the problem associated with hot carrier injection which results from the high electric fields encountered with the smaller geometry devices. The problem caused by the hot carrier injection is one of oxide damage where the term oxide damage refers to both the incorporation of fixed charges within the oxide and the increase in the density of interface states at the interface between the oxide and adjacent silicon or polycrystalline silicon material.

A number of attempts have been made to change the device design to overcome or lessen the hot carrier injection problem. Almost all of the existing solutions address the problem of hot carrier injection by attempting to reduce the lateral electric fields within the device in order to decrease the hot carrier generation rate. The most notable design change has been the introduction of the lightly doped drain (LDD) structure which was introduced to enhance the reliability of insulated gate field effect transistors (IGFET) while maintaining a 5 Volt power supply with gate lengths in the range of one micrometer. The LDD structure, and the numerous modifications of the LDD structure which have been proposed, have the goal of reducing the impact ionization rate by decreasing the electric field peak in the critical region where the device channel and drain region intersect. The various LDD structures have been successful in reducing the hot carrier injection problem in those devices for which it was designed. As device designs shrink even further to the submicrometer and even sub-half micrometer range, however, the LDD structure cannot provide sufficient protection against the problem. Even with scaling back of the power supply voltage to 3.3 Volts, the LDD structure is not adequate for the very short channel lengths which are desired and which are becoming increasingly necessary. An additional problem with the LDD structure is that the more lightly doped is the drain region, which serves to reduce the lateral electric field, the more serious is the increase in the series resistance of the current path through the drain region.

The LDD structure is a planar structure. To push the state-of-the-art in small devices beyond the planar LDD structure, a new type of elevated drain structure has been proposed for reducing hot carrier generation. The hot carrier suppression (HCS) structure differs markedly from the LDD type device in that a low doped (about $10^{16} cm^{-3}$) $N^-$ polycrystalline silicon layer is located above the conventional LDD $N^-$ drain region and is capped with a horizontal $N^+$ layer. (In this and the following discussion, the superscript plus and minus signs are used in conventional manner to indicate relative doping concentration.) The HCS structure reduces the electric fields substantially and allows scaling of the IGFET down to the quarter micrometer range because of reduced charge sharing effects in the channel and reduced lateral dimensions of the source/drain regions. This source/drain construction, however, suffers from several structural drawbacks even beyond those of manufacturability issues. The highest fields and current densities in the HCS structure are located at or near the oxide corner which is formed at the oxide/silicon and the oxide/polycrystalline silicon interfaces. This means that the hot carriers which are generated are generated very close to the oxide interface and their high energy cannot be attenuated by scattering mechanisms within either the silicon or the polycrystalline silicon regions. Moreover, the quality of the oxide on the sidewall of the gate electrode is usually lower than that of the gate oxide, thus rendering the sidewall oxide interface highly vulnerable to hot carrier injection. In addition, any sidewall oxide damage can easily deplete the underlying adjacent $N^-$ layer and significantl affect the transistor performance by increasing the series on-resistance of the device.

Thus it is apparent that a need existed for an improved insulated gate field effect transistor (IGFET) which would provide relief from the effects of hot carrier injection and not, at the same time, cause other serious device design, manufacturability, or reliability problems.

SUMMARY OF THE INVENTION

An insulated gate field effect transistor is provided which includes a vertically layered elevated source/drain structure. In accordance with a preferred embodiment, a semiconductor substrate of a first conductivity type is provided. A gate insulator is disposed on a surface of that semiconductor substrate and a gate electrode, in turn, is disposed on the gate insulator. A lightly doped drain region of second conductivity type is formed in the substrate in alignment with the gate electrode. An electrically conductive suppression region of first electrical resistivity is provided which electrically contacts the drain region but which is electrically isolated from the gate electrode and is spaced apart from the gate electrode. A drain contact electrically contacts the drain region and is spaced apart from the gate electrode by a distance which is greater than the space between the gate electrode and the electrically conductive suppression region. The drain contact also has a resistivity which is significantly less than the resistivity of the electrically conductive suppression region.

DESCRIPTION OF A PREFERRED EMBODIMENT

Figure 1:
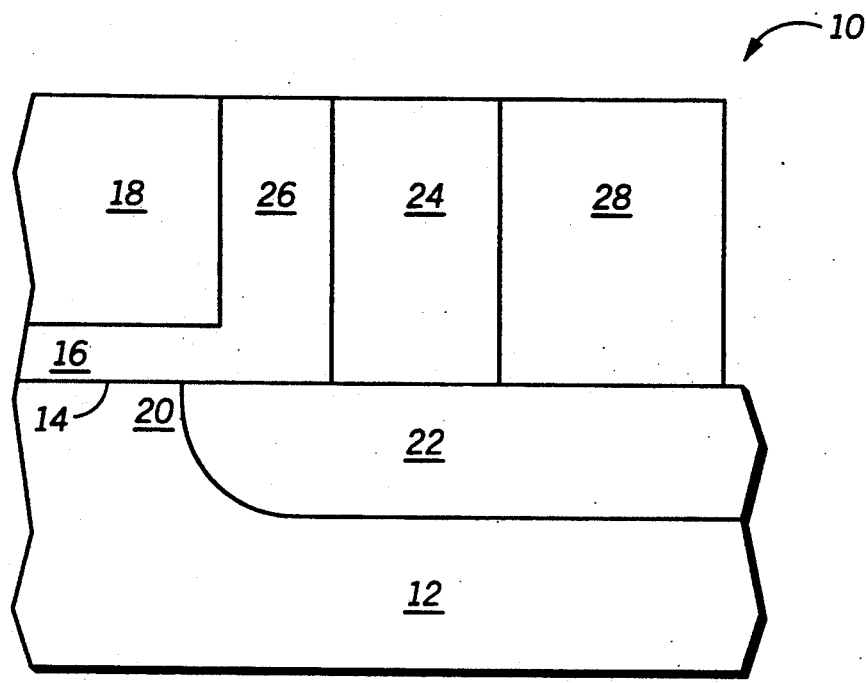
FIG. 1 illustrates schematically, in cross-section, a portion of an insulated gate field effect transistor in accordance with one embodiment of the invention.

Past attempts at reducing the problem of hot carrier injection have concentrated on reducing the number of hot carriers which are generated. The inventors have determined that significant improvement in device characteristics and reliability can be achieved, not by concentrating on the number of hot carriers which arrive at the insulator/silicon interfaces of interest, but rather by focusing on reducing the number of hot carriers having sufficient energy to overcome the potential barrier and cause oxide damage. The improvement is achieved through a structural approach which gives consideration to how a given oxide damage affects the I-V characteristics of an IGFET. Illustrated in FIG. 1 is a portion of a semiconductor device 10 which illustrates the essential feature of the vertically layered elevated drain (VLED) structure in accordance with the invention which provides a hot carrier resistant source/drain structure for short channel IGFETs. Device 10 includes a semiconductor substrate 12 of first conductivity type which has a principle surface 14. For purposes of illustration, the device described is an N channel device and hence the substrate is of P type conductivity. In a preferred embodiment substrate 12 is a substrate of monocrystalline silicon doped with boron to a concentration in the range of $0.5-5.0 \times 10^{17} cm^{-3}$. Overlying a portion of substrate 12 is a gate insulator 16 such as a silicon dioxide having a thickness of about 6-15 nanometers. Overlying gate insulator 16 is a gate electrode 18. Preferably gate electrode 18 is N doped polycrystalline silicon having a doping density of about $10^{20} cm^{-3}$ and a thickness of about 300-500 nanometers. Gate electrode 18 overlies a channel region 20 in substrate 12 through which, during the operation of the device, electrons pass from source (not shown) to drain under the influence of the bias applied to the source, drain, and gate electrodes.

A lightly doped N type drain region 22 is formed at the surface 14 of substrate 12. Preferably drain region 22 is doped with arsenic to a concentration of about $10^{18} cm^{-3}$ and has a junction depth of about 0.05-0.10 micrometers.

In accordance with the invention, device 10 includes a lightly doped region 24 which is spaced apart from gate electrode 18 by sidewall insulator 26. Lightly doped region 24 is preferably polycrystalline silicon which is even more lightly doped than is region 22. The doping concentration of region 24 can be N or P type and preferably has a doping concentration of $10^{16} cm^{-3}$ or lower for N type and slightly higher for P type. The lightly doped region 24 functions, as explained below, as a suppression region for hot carriers which are generated in the path of the electron flow. Insulator layer 26 is preferably silicon dioxide having a thickness of about 10-25 nanometers. The illustrated device structure also includes, in accordance with the invention, a drain contact 28 which is positioned adjacent to the lightly doped region 24. Drain contact 28 is heavily doped and preferably is polycrystalline silicon doped with arsenic or phosphorus to near solid solubility. Both lightly doped region 24 and drain contact 28 are directly in electrical contact with drain region 22. Lightly doped region 24 is spaced apart from gate electrode 18 by insulator 26. Drain contact 28 is spaced apart from gate electrode 18 by the thickness of lightly doped region 24 and insulator 26. Lightly doped region 24 is more lightly doped with conductivity determining impurities than is drain region 22. Drain contact region 28 is more heavily doped with conductivity determining impurities than is either lightly doped region 24 or drain region 22.

Device 10 illustrated in FIG. 1 can be fabricated using conventional semiconductor device processing steps. For example, gate insulator 16 can be grown by thermal oxidation. Insulator 26 can be formed by oxidizing the edge of gate electrode 18 or can be deposited, for example by conventional or low pressure chemical vapor deposition. Gate electrode 18, lightly doped region 24, and drain contact 28 are preferably formed by the low pressure chemical vapor deposition of polycrystalline silicon. The lightly doped region 24 can be formed, for example, by depositing a conformal layer of polycrystalline silicon which is subsequently anisotropically etched by reactive ion etching to form the region 24 as a sidewall spacer on the oxidized edge of gate electrode 18. Region 22 is preferably formed by ion implantation using gate electrode 18 as an ion implantation mask.

Figure 2:
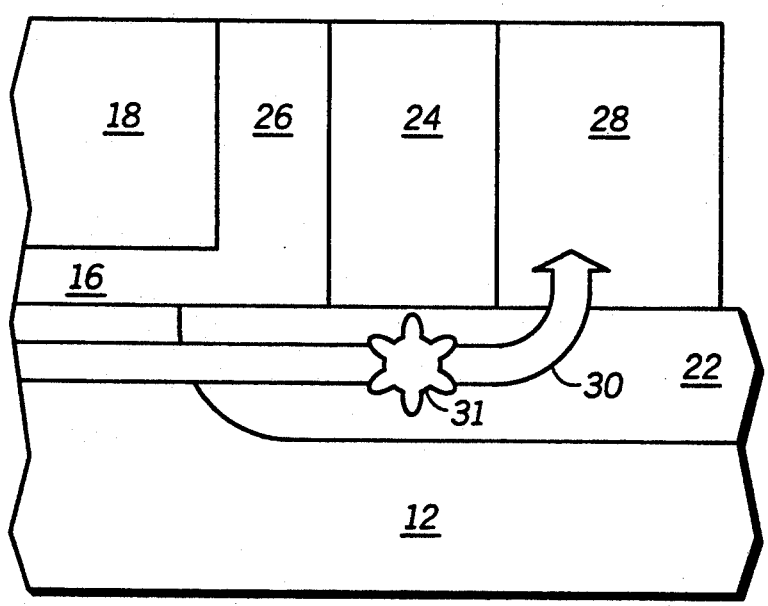
FIG. 2 illustrates schematically, in cross-section, the effect of the inventive insulated gate field effect transistor on the problem of hot carrier injection.

The operation of device 10 to reduce the problem of hot carrier injection is illustrated in FIG. 2. During operation of the device, electrons (in this illustrative N channel embodiment) flow from the device source, through the channel region, to the drain and drain contact as illustrated by arrow 30. The lightly doped region 24 is of high resistivity and hence electrons flowing from the source to drain do not enter lightly doped region 24, but instead, flow parallel to the substrate surface in the N− drain region below the lightly doped region 24 and eventually enter the N+ drain contact region 28. In an optimized device, the doping of the lightly doped drain region 22 and its lateral sub-diffusion are chosen such that the peak lateral field of the operating device is located under the lightly doped suppression region 24. This means that the avalanche peak (illustrated at 31) will also lie beneath the lightly doped suppression region 24. Hot carriers generated at that avalanche peak will be injected into the high resistivity and lightly doped region 24 as illustrated by arrows 30 where they lose their energy (or in the case of P type doping in region 24, in addition to the aforementioned and main effect, will be annihilated by recombination with a hole) and therefore, will not be able to cause damage to either the gate oxide 16 or insulator 26. However, because the lightly doped region is a conductor, even though a high resistivity conductor, the injected carriers cannot accumulate in that region but are swept to the drain contact 28. In addition, and equally important, any damage which does result to the sidewall spacer has limited impact on the I-V characteristics as discussed below.

Figure 3:
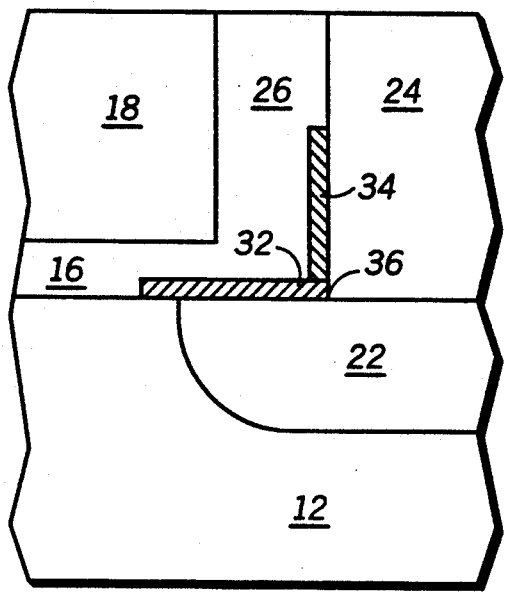
FIG. 3 illustrates schematically, in cross-section, the location of the insulator damage which causes the significant problems with hot carrier injection.

FIG. 3 illustrates in a cross section of a portion of device 10, the two important damage mechanisms which result in the hot carrier injection problem. FIG. 3 also serves to illustrate why those problems are minimized in a device and in accordance with the invention. In the portion of the device illustrated, gate electrode 18 is separated from substrate 12 by gate insulator 16 and from lightly doped region 24 by a sidewall insulator 26. Lightly doped drain region 22 forms a PN junction with substrate 12. As a result of the operation of the device, hot carriers are generated in drain region 22 with sufficient energy to surmount the insulator-silicon barrier to cause damage 32 at the gate insulator-silicon interface and additional damage 34 at the sidewall insulator-lightly doped region interface. In each case the damage includes trapped charges, interface states, and the like.

Damage 32, in structures in accordance with the invention, is minimized by displacing the avalanche peak laterally (to the right in FIG. 3) away from insulator/silicon interface 36. In a conventional structure the hot carriers are created directly at the interface, near the insulator, and reach the potential barrier between the insulator and silicon with no energy loss. Hence, a large proportion of the hot carriers are able to surmount the potential barrier and contribute to the damage mechanism. In the device structure in accordance with the invention, the avalanche peak is displaced away from the interface 36 and the number of hot carriers which are injected is significantly decreased, causing a decrease in the severity of the hot carrier injection problem. Calculations indicate, for example, that if the avalanche peak is displaced away from corner 36 by 13 nanometers, the injection rate is attenuated for the inventive structure as compared to a conventional structure by a factor of 0.0016 and by a factor of 0.02 compared to the HCS structure.

The presence of damage 32, 34, can cause a change in the threshold voltage of the device during operation and can also cause a change in the I-V characteristics of the device. The effect on threshold voltage is an obvious one because the damage can be visualized as an imposed bias which must be compensated for by the impressed gate voltage. The effect on the I-V characteristics comes from the influence of the damage on the conductivity of the adjacent silicon. The presence of the damage regions causes a depletion in the already lightly doped drain region, thus decreasing the conductivity of this region. In the HCS structure in which the lightly doped drain region is overlaid by a lightly doped drain contact region, the presence of the damage region depletes carriers and decreases the conductivity of both the drain region and the overlying drain contact. In the structure in accordance with the invention, however, this effect is minimized because the lightly doped region 24 carries only a small portion of the current in comparison to the more heavily doped drain contract 28. Hence, modulation of the conductivity in lightly doped region 24 has only a minor effect on device characteristics. In addition, because of the displacement of the avalanche peak as explained above, the total amount of carrier injection is minimized so that both the threshold voltage variation and the variation of I-V characteristics are minimized.

Figure 4:
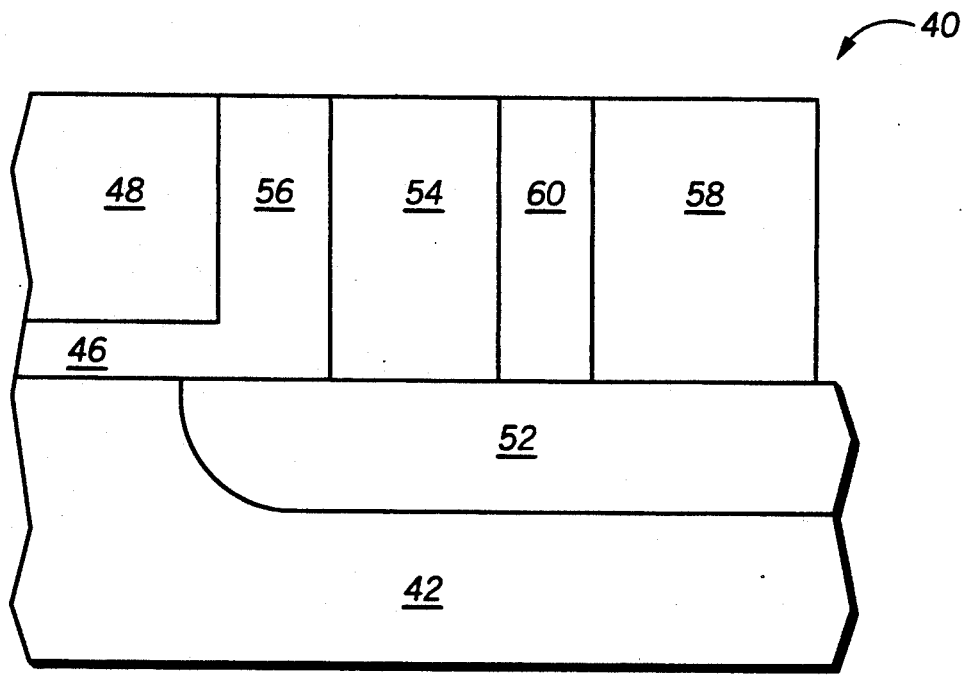
FIG. 4 illustrates schematically, in cross-section, a further embodiment of the invention.

FIG. 4 illustrates, in cross section, a further device structure 40 in accordance with a further embodiment of the invention. Device structure 40 is similar to device structure 10, described above, in that it includes a substrate 42, an overlying gate insulator 46, a gate electrode 48, a lightly doped drain region 52, a lightly doped hot carrier suppression region 54, sidewalls spacer insulator 56, and drain contact electrode 58. In addition, device 40 includes an additional dielectric layer 60 between lightly doped region 54 and heavily doped drain contact region 58. This additional dielectric layer acts as a diffusion barrier between the lightly doped and heavily doped regions and prevents the inadvertent doping of lightly doped region 54. The additional dielectric layer also acts to prevent the spill over of carriers from drain contact electrode 58 into lightly doped region 54 during operation of the device. Spill over of carriers would modulate the conductivity of the lightly doped region. In each case, the additional dielectric layer serves to maintain the high resistivity of region 54 and prevents an appreciable amount of the device current from entering low doped region 54 instead of traveling through drain region 52 to the heavily doped drain contact region 58. The presence of extra dielectric region 60 thus helps to ensure that the hot carrier injected damage regions have a minimal effect on the I-V characteristics of the device.

Thus it is apparent that there has been provided, in accordance with the invention, an improved insulated gate field effect transistor structure which overcomes or minimizes many of the problems associated with hot carrier injection. Although the device has been described and illustrated with reference to specific embodiments thereof, it is not intended that the invention be limited to these illustrative embodiments. Those skilled in the art will recognize that variations and modifications can be made without departing from the true spirit of the invention. For example, those skilled in art will recognize that the device structure is applicable to P channel and CMOS structures as well. In addition, other materials may be substituted for the insulators and conductors described in the illustrative embodiments. Still further, the doping densities described and the methods for achieving those doping densities may be modified in a manner known to those skilled in the art of device design. Accordingly, it is intended to encompass within the invention all such variations and modifications as fall within the scope of the appended claims.

We claim:

1. An insulated gate field effect transistor comprising:
   a semiconductor substrate of a first conductivity type having a surface;
   a gate insulator disposed on the surface;
   a gate electrode disposed on the gate insulator;
   a lightly doped drain region of a second conductivity type formed in the substrate in alignment with the gate electrode;
   an electrically conductive suppression region of a first electrical resistivity electrically contacting the drain region, electrically isolated from the gate electrode and spaced a first distance from the gate electrode, wherein the electrically conductive suppression region comprises impurity doped polycrystalline silicon and has an electrical resistivity greater than the electrical resistivity of the lightly doped drain region; and
   a drain contact electrically contacting the drain, spaced a second distance greater than the first distance from the gate electrode, and having a second electrical resistivity which is less than the first electrical resistivity.

2. The insulated gate field effect transistor of claim 1 wherein the electrically conductive suppression region is of the first conductivity type.

3. The insulated gate field effect transistor of claim 1 wherein the electrically conductive suppression region is of the second conductivity type.

4. The insulated gate field effect transistor of claim 1 wherein the gate electrode comprises polycrystalline silicon and the electrically conductive suppression region is electrically isolated from the gate electrode by a thermal oxide formed on an edge of the gate electrode.

5. The insulated gate field effect transistor of claim 1 wherein the drain contact contacts the electrically conductive suppression region.

6. An insulated gate field effect transistor comprising:

a semiconductor substrate of a first conductivity type having a surface;

a gate insulator disposed on the surface;

a gate electrode disposed on the gate insulator;

a lightly doped drain region of a second conductivity type formed in the substrate in alignment with the gate electrode;

an electrically conductive suppression region of a first electrical resistivity electrically contacting the drain region, electrically isolated from the gate electrode and spaced a first distance from the gate electrode;

a drain contact electrically contacting the drain region, spaced a second distance greater than the first distance from the gate electrode, and having a second electrical resistivity which is less than the first electrical resistivity; and means for preventing the modulation of the conductivity of the electrically conductive suppression region caused by carrier spill over or impurity doping from the drain contact.

7. The insulated gate field effect transistor of claim 6 wherein the means for preventing comprises an electrically insulating material positioned between the electrically conductive suppression region and the drain contact.

8. An insulated gate field effect transistor comprising:

a gate electrode;

a drain region of a first resistivity aligned with the gate electrode;

a conductive electrode of a second resistivity overlying and electrically contacting the drain region, the second resistivity greater than the first resistivity; and a drain contact electrode of a third resistivity less than the first resistivity overlying and electrically contacting the drain region, the conductive electrode positioned between the gate electrode and the drain contact electrode.

9. The insulated gate field effect transistor of claim 8 further comprising an insulating layer positioned between the conductive electrode and the drain contact electrode.

10. The insulated gate field effect transistor of claim 8 wherein the drain region is of a first conductivity type and the conductive electrode comprises polycrystalline silicon of an opposite conductivity type.

11. The insulated gate field effect transistor of claim 8 wherein the conductive electrode comprises polycrystalline silicon of the same conductivity type as the drain region.

12. The insulated gate field effect transistor of claim 11 further comprising means for preventing the modulation of conductivity of the conductive electrode caused by impurity doping from the drain contact electrode or carrier spill over from the drain contact electrode.

13. The insulated gate field effect transistor of claim 8 wherein the conductive electrode comprises polycrystalline silicon electrically separated from the gate electrode by an insulating sidewall spacer on the edge of the gate electrode.

14. The insulated gate field effect transistor of claim 13 wherein the drain contact electrode comprises polycrystalline silicon of the same conductivity type as the drain region.

* * * * *